(12) United States Patent
Tessariol et al.

(10) Patent No.: US 9,941,209 B2
(45) Date of Patent: Apr. 10, 2018

(54) CONDUCTIVE STRUCTURES, SYSTEMS AND DEVICES INCLUDING CONDUCTIVE STRUCTURES AND RELATED METHODS

(71) Applicant: Micron Technology, Inc., Boise, ID (US)

(72) Inventors: Paolo Tessariol, Montebelluna (IT); Graham R. Wolstenholme, Boise, ID (US); Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/068,329

(22) Filed: Mar. 11, 2016

(65) Prior Publication Data
US 2017/0263556 A1 Sep. 14, 2017

(51) Int. Cl.
*H01L 21/768* (2006.01)
*H01L 23/528* (2006.01)
(Continued)

(52) U.S. Cl.
CPC .... *H01L 23/5283* (2013.01); *H01L 21/76816* (2013.01); *H01L 21/76877* (2013.01);
(Continued)

(58) Field of Classification Search
CPC ......... H01L 29/42324; H01L 27/11517; H01L 27/1157; H01L 27/11582; H01L 27/11556;
(Continued)

(56) References Cited

U.S. PATENT DOCUMENTS

| | | |
|---|---|---|
| 5,707,885 A | 1/1998 | Lim |
| 6,858,906 B2 | 2/2005 | Lee et al. |

(Continued)

FOREIGN PATENT DOCUMENTS

| | | |
|---|---|---|
| CN | 1418374 A | 5/2003 |
| JP | 59182570 A | 10/1984 |

(Continued)

OTHER PUBLICATIONS

Endoh et al., Novel Ultrahigh-Density Flash Memory With a Stacked-Surrounding Gate Transistor (S-SGT) Structured Cell, IEEE Transactions on Electron Devices, vol. 50, No. 4, Apr. 2003, pp. 945-951.

(Continued)

*Primary Examiner* — Thanh T Nguyen
(74) *Attorney, Agent, or Firm* — TraskBritt

(57) ABSTRACT

Conductive structures include stair step structures positioned along a length of the conductive structure and at least one landing comprising at least one via extending through the conductive structure. The at least one landing is positioned between a first stair step structure of the stair step structures and a second stair step structure of the stair step structures. Devices may include such conductive structures. Systems may include a semiconductor device and stair step structures separated by at least one landing having at least one via formed in the at least one landing. Methods of forming conductive structures include forming at least one via through a landing positioned between stair step structures.

38 Claims, 7 Drawing Sheets

(51) Int. Cl.
*H01L 23/522* (2006.01)
*H01L 27/11524* (2017.01)
*H01L 27/1157* (2017.01)
*H01L 27/11517* (2017.01)

(52) U.S. Cl.
CPC ...... *H01L 23/5226* (2013.01); *H01L 27/1157* (2013.01); *H01L 27/11517* (2013.01); *H01L 27/11524* (2013.01)

(58) Field of Classification Search
CPC ............. H01L 27/11524; H01L 27/115; H01L 27/0207; H01L 23/53209; H01L 21/76877; H01L 21/76841; H01L 21/28518; H01L 23/5283; H01L 23/5226; H01L 21/768; H01L 21/76879
See application file for complete search history.

(56) References Cited

U.S. PATENT DOCUMENTS

| | | |
|---|---|---|
| 7,091,118 B1 | 8/2006 | Pan et al. |
| 7,253,467 B2 | 8/2007 | Lee et al. |
| 7,315,474 B2 | 1/2008 | Lue |
| 7,361,554 B2 | 4/2008 | Park et al. |
| 7,701,771 B2 | 4/2010 | Jeong et al. |
| 7,776,683 B2 | 8/2010 | Tran et al. |
| 7,875,985 B2 | 1/2011 | Hiller et al. |
| 8,405,142 B2 | 3/2013 | Katsumata et al. |
| 9,165,937 B2 | 10/2015 | Yip et al. |
| 2006/0180851 A1 | 8/2006 | Lee et al. |
| 2007/0252201 A1 | 11/2007 | Kito et al. |
| 2009/0020744 A1 | 1/2009 | Mizukami et al. |
| 2009/0212350 A1 | 8/2009 | Kidoh et al. |
| 2009/0310415 A1 | 12/2009 | Jin et al. |
| 2010/0090188 A1 | 4/2010 | Futatsuyama |
| 2010/0133599 A1 | 6/2010 | Chae et al. |
| 2010/0224962 A1* | 9/2010 | Kim ............... H01L 23/5228 257/536 |
| 2010/0230724 A1 | 9/2010 | Sinha et al. |
| 2011/0018036 A1 | 1/2011 | Hwang et al. |
| 2011/0031630 A1 | 2/2011 | Hashimoto |
| 2011/0065272 A1 | 3/2011 | Mizukami et al. |
| 2011/0115010 A1 | 5/2011 | Shim et al. |
| 2011/0244666 A1 | 10/2011 | Kim et al. |
| 2012/0261722 A1 | 10/2012 | Tang et al. |
| 2012/0306089 A1 | 12/2012 | Freeman et al. |
| 2013/0009274 A1 | 1/2013 | Lee et al. |
| 2015/0001613 A1 | 1/2015 | Yip et al. |

FOREIGN PATENT DOCUMENTS

| | | |
|---|---|---|
| JP | 2011060958 A | 3/2011 |
| TW | 479294 B | 3/2002 |

OTHER PUBLICATIONS

Fukuzumi et al., Optimal Integration and Characteristics of Vertical Array Devices for Ultra-High Density, Bit-Cost Scalable Flash Memory, Electron Devices Meeting, Dec. 10-12, 2007, pp. 449-452.

Tanaka et al., Bit Cost Scalable Technology with Punch and Plug Process for Ultra High Density Flash Memory, 2007 Symposium on VLSI Technology Digest of Technical Papers, Jun. 12-14, 2007, pp. 14-15.

Taylor, Colleen, Toshiba Touts 3D NAND Cell Array as Ticket to Higher Density NAND, EDN Network, http://www.edn.com/electronics-news/4316729/Toshiba-touts-3D-NAND-cell-array-as-ticket-to-higher-density-NAND, Jun. 12, 2007, 2 pages.

Yip, Aaron, U.S. Appl. No. 15/053,291, filed Feb. 25, 2016, for Memory Devices With Stairs in a Staircase Coupled to Tiers of Memory Cells and to Pass Transistors Directly Under the Staircase.

International Search Report for International Application No. PCT/US2017/020456, dated Jun. 7, 2017, 4 pages.

International Written Opinion for International Application No. PCT/US2017/020456, dated Jun. 7, 2017, 8 pages.

\* cited by examiner

CONDUCTIVE STRUCTURES, SYSTEMS AND DEVICES INCLUDING CONDUCTIVE STRUCTURES AND RELATED METHODS

TECHNICAL FIELD

Embodiments of the present disclosure relate to conductive structures (e.g., an elongated stair step conductive structure) having contacts extending through at least a portion of the conductive structure, to devices including such conductive structures, to systems including such devices, to methods of forming such conductive structures and to methods of forming electrical connections for an elongated stair step conductive structure.

BACKGROUND

Memory devices are conventionally provided in computers and other electronic devices in the form of semiconductor-based integrated circuits. There are many different types of memory devices including random-access memory (RAM), read-only memory (ROM), synchronous dynamic random-access memory (SDRAM), dynamic random-access memory (DRAM), and non-volatile memory. As the performance and complexity of electronic systems increase, the requirement for additional memory in memory systems also increases. The trend in the semiconductor industry is toward smaller memory devices that may be fabricated as high-density circuits on a single semiconductor chip. Miniaturization of transistor devices and circuits may be achieved by reducing the size of at least some of the features of devices so that the resulting devices occupy a smaller surface area of a wafer.

To reduce costs of fabricating such high-density memory arrays, the parts count must be kept to a minimum. This means being able to achieve a higher density of memory on a single chip instead of by stacking separate memory chips. However, as memory devices decrease in size while increasing the number of memory cells in a memory array, the number of internal connections necessary to operate each memory device also increases.

For example, in non-volatile memory (e.g., NAND flash memory), one way to increase memory density is by using a vertical memory array, which is also referred to as a three-dimensional (3-D) array. Such vertical memory arrays are disclosed in, for example, U.S. Patent Application Publication No. 2007/0252201 to Kito et al., now U.S. Pat. No. 7,936,004, issued May 3, 2011. Conventional vertical memory arrays require electrical connection between the conductive plates and access lines (e.g., word lines) so that memory cells in the array may be uniquely selected for writing or reading functions by control units. One type of vertical memory array includes semiconductor pillars that extend through holes in layered conductive plates (also referred to as word line plates or control gate plates), with dielectric materials at each junction of the pillars and the conductive plates. Thus, multiple transistors can be formed along each pillar. This structure enables a greater number of transistors to be located in a unit of die area by building the array upwards (vertically) on a die. However, in such a device each memory cell must include multiple conductive connections (e.g., word lines, bit lines, select gates, etc.) in order to read, write, and erase each individual memory cell or plurality of memory cells. In such a memory array having a high density of memory cells, it may be difficult to provide the connections to each memory cell in an effective and efficient manner.

As the number of tiers in the memory cell, and thus the number of conductive plates, increases so does the number of conductive connections required to connect the conductive plates. The conductive connections may increase until there is not enough room in a block dimension (e.g., span) to accommodate all of the pass conductive connections, at which point the size (e.g., pitch) of the stacked memory array needs to be increased to accommodate the extra conductive connections and control units. For example, in a 3-D NAND array, block pitch is dictated by the need to route the word line signals through conductive connections. Increasing the number of memory cells in the array generally requires that the block pitch also be increased to accommodate the additional plates and associated connections. Such an increase in the number of plates also increases the total word line (WL) capacitance requiring that the pump work harder, thereby, using higher power and reducing performance. Further, the increase in the number of drain selectors also proportionally increases, which increase may be problematic for devices requiring a lower amount of pages per block (e.g., devices where a finer erase granularity is required).

DETAILED DESCRIPTION

Figure 1:
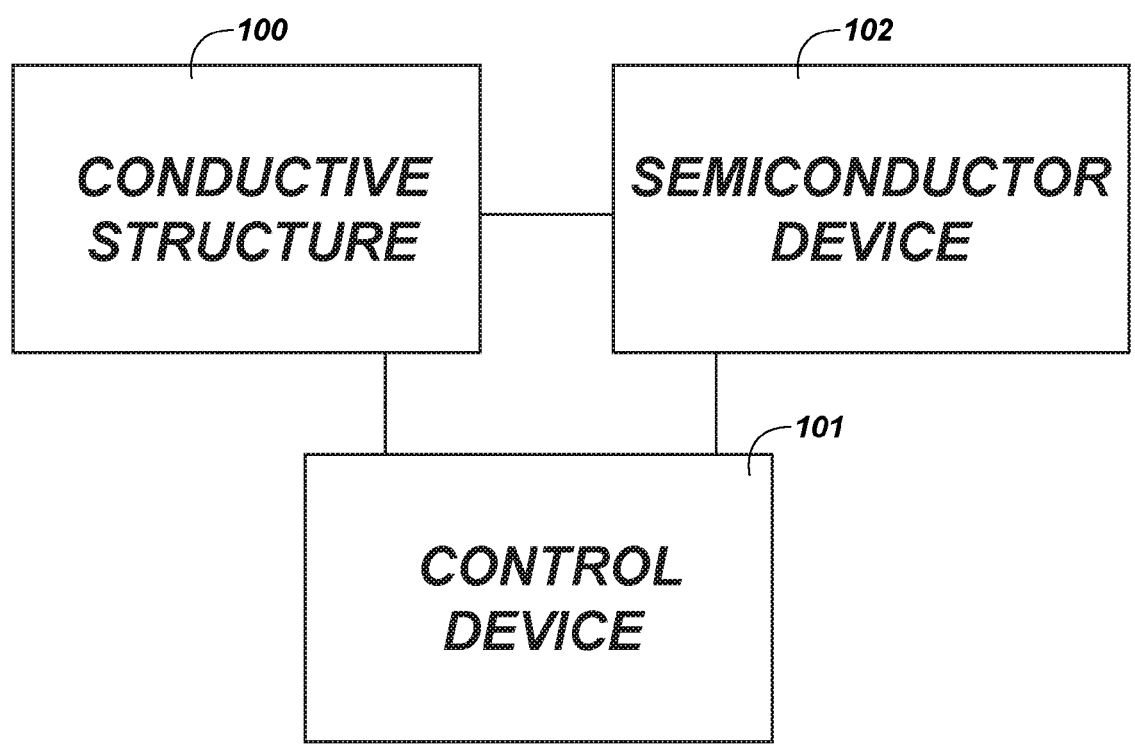
FIG. 1 is a schematic block diagram of an embodiment of an electronic device including a conductive structure and a semiconductor device in accordance with an embodiment of the present disclosure.

As used herein, any relational term, such as "first," "second," "over," "under," "on," "underlying," "overlying," etc., is used for clarity and convenience in understanding the disclosure and drawings and does not connote or depend on any specific preference, orientation, or order.

As used herein, the terms "distal" and "proximal" describe positions of elements of conductive structures in relation to a substrate upon which the conductive structures are formed. For example, the term "distal" refers to a position relatively more distant from the substrate, and the term "proximal" refers to a position in closer relative proximity to the substrate.

As used herein, the terms "lateral" and "longitudinal" describe directions of elements of the conductive structures in relation to a substrate upon which the conductive structures are formed. In particular, the terms "lateral" and "longitudinal" describe axes along a plane extending transverse (e.g., perpendicular) to an axis ending from a proximal end to a distal end of the conductive structures (e.g., along a plane lying substantially on a distalmost portion of the conductive structure). For example, the term "lateral" refers to a direction transverse (e.g., perpendicular) to the axis ending from the proximal end to the distal end of the conductive structures along a minor axis of the structure. The term "longitudinal" refers to a direction extending parallel to the axis ending from the proximal end to the distal end of the conductive structures along a major axis of the structure.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not form a complete process flow for manufacturing a device or system. The structures described below do not form a complete device or system. Only those process acts and structures necessary to understand the embodiments of the present disclosure are described in detail below. Additional acts to form complete conductive structures and semiconductor devices may be performed by conventional fabrication techniques. Further, the acts described below may be performed in multiple acts or multiple acts may be performed substantially simultaneously.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, structure, or memory cell, but are merely idealized representations employed to describe the embodiments of the present disclosure. The drawings presented herein are not necessarily drawn to scale. Additionally, elements common between drawings may retain the same numerical designation.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

FIG. 1 is a schematic block diagram of an electronic device such as, for example, a non-volatile memory device (e.g., a vertical memory device such as a three-dimensional NAND memory device) including one or more conductive structures 100 and one or more semiconductor devices 102 (e.g., a plurality of memory cells, a CMOS device, etc.). For example, the electronic device may include one or more conductive structures 100 directly or indirectly connected to and in communication with (e.g., in electrical communication with, in direct or indirect contact with) one or more semiconductor devices 102. It is noted that while conductive structures described herein may make specific reference to use with a NAND device, the disclosure is not so limited and may be applied to other semiconductor and memory devices.

In some embodiments, the electronic device may include a semiconductor device (e.g., control device 101) including circuitry for controlling one or more of the conductive structures 100 and the semiconductor devices 102 as discussed below in greater detail.

The electronic device shown in FIG. 1 may comprise, for example, a computer or computer hardware component, a server or other networking hardware component, a cellular telephone, a digital camera, a personal digital assistant (PDA), portable media (e.g., music) player, etc. The electronic device further may include at least one electronic signal processor device (often referred to as a "microprocessor"). The electronic device may, optionally, further include one or more input devices for inputting information into the electronic device by a user, such as, for example, a mouse or other pointing device, a keyboard, a touchpad, a touchscreen, a button, or a control panel and one or more output devices for outputting information (e.g., visual or audio output) to a user such as, for example, a monitor, display, printer, speaker, etc.

Figure 2:
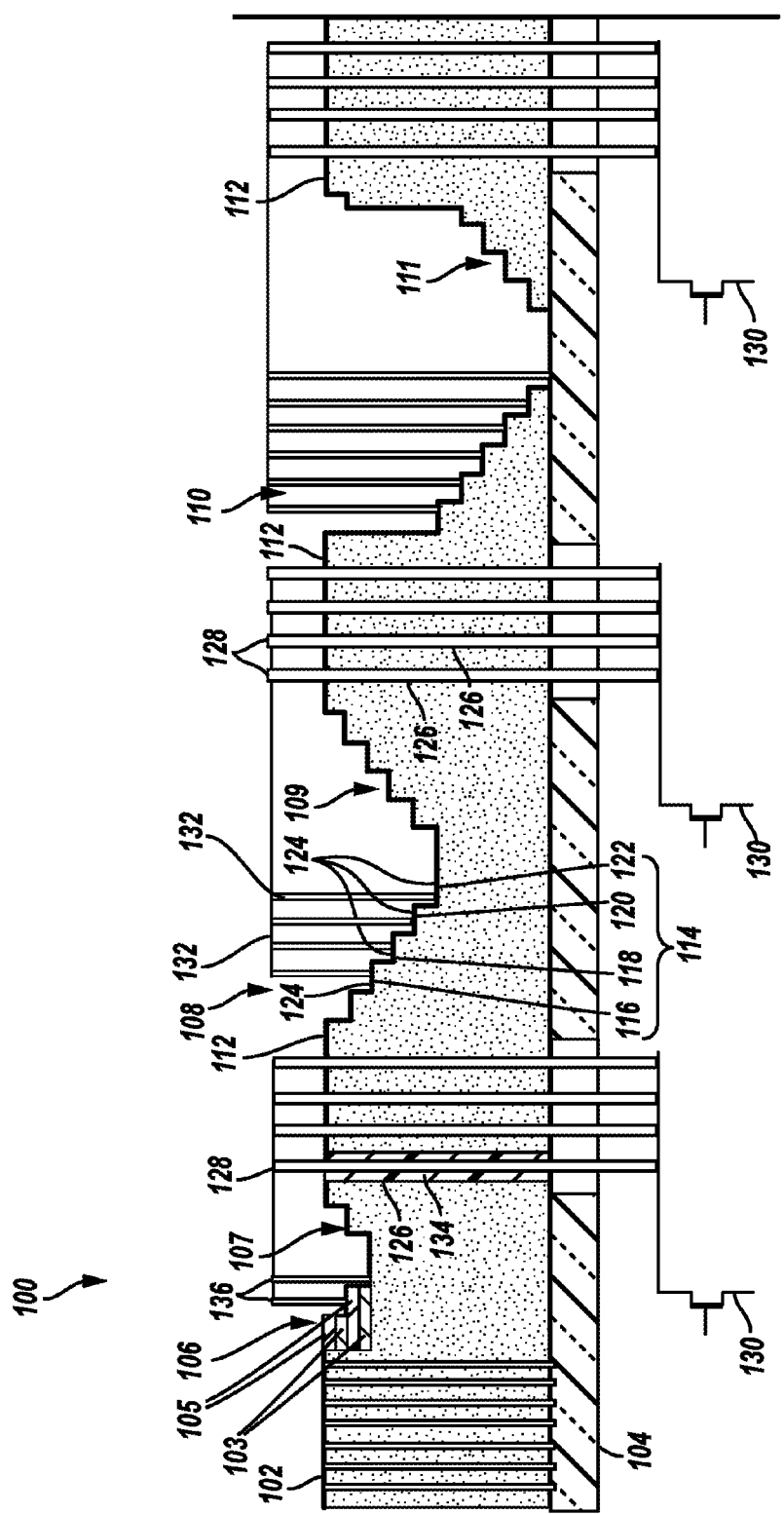
FIG. 2 is a simplified cross-sectional side view of a portion of an electronic device including a conductive structure and a semiconductor device in accordance with an embodiment of the present disclosure.

FIG. 2 is a simplified cross-sectional illustration of an electronic device including a conductive structure 100 and a semiconductor device 102 that may include one or more stacks (e.g., tiers) of conductive and insulative materials on a substrate 104 (e.g., array base) for communicating with (e.g., controlling) one or more portions of the semiconductor device 102. In some embodiments, the substrate 104 may include one or more conductive materials and insulative materials for routing signals to and/or from the conductive structure 100 and/or the semiconductor device 102. For example, the substrate 104 may form at least a portion of the semiconductor or control device 101 (FIG. 1) that controls one or more of the conductive structures 100 and the semiconductor devices 102. The substrate 104 may include multiple portions that may support and/or isolate one or more of the conductive structures 100 and the semiconductor devices 102 where circuitry (e.g., control units, discussed below) and/or interconnections under array are provided for the electronic device.

In some embodiments, the conductive structure 100 and the semiconductor device 102 may comprise an integrated structure (e.g., formed together concurrently). In additional embodiments, the conductive structure 100 and the semiconductor device 102 may be separate structures that are electrically connected together (e.g., formed separately).

Conductive materials as discussed herein, in some embodiments, may be formed from a material such as, for example, a metal material (e.g., W, Ni, tantalum nitride (TaN), Pt, tungsten nitride (WN), Au, titanium nitride (TiN), or titanium aluminum nitride (TiAlN)), polysilicon, other conductive materials, or combinations thereof.

In some embodiments, the substrate 104 may include any structure that includes a semiconductor type material including, for example, silicon (e.g., polysilicon), germanium, gallium arsenide, indium phosphide, and other III-V or II-VI type semiconductor materials. Substrates 104 may include, for example, not only conventional substrates but also other bulk semiconductor substrates such as, by way of example and not limitation, silicon-on-insulator (SOI) type substrates, silicon-on-sapphire (SOS) type substrates, and epitaxial layers of silicon supported by another material. Furthermore, when reference is made to a "substrate" in the following description, previous process steps may have been utilized to at least partially form elements or components of a circuit or device in or over a surface of the substrate. In some embodiments, the substrate 104 may include any structure that the conductive structure 100 may be formed over (e.g., on) including, for example, other portions of an electronic device or semiconductor device 102 (FIG. 1).

By way of example and not limitation, insulative materials (e.g., an electrically insulative material, such as a dielectric material) discussed herein may include any suitable at least partially electrically insulating materials such as an oxide material (e.g., $SiO_2$, $Al_2O_3$, etc.), a nitride material (e.g., $Si_3N_4$, AlN, etc.), or a combination of oxide and nitride materials such as, for example, an oxynitride material, a re-oxidized oxynitride material, or a so-called "oxide-nitride-oxide" (ONO) structure. In some embodiments, insulative materials may each comprise similar materials, dissimilar materials, or combinations thereof.

One or more portions of the conductive structure 100 may be formed as a so-called "stair step" structure including a plurality of steps or tiers where each step includes at least one conductive material 103 (e.g., polysilicon, other conductive materials, such as metal, or combinations thereof). Steps of the stair step structures 106, 108, 110 (e.g., which may act as or act to select word line plates, bit lines, selection gates) may include conductive materials 103 that are in communication with a portion of the semiconductor device 102 (e.g., one row of memory cells). The conductive material 103 of a step is at least partially separated or isolated (e.g., electrically and/or physically) from the conductive material 103 of adjacent steps (e.g., by insulative materials 105). For clarity, only a portion of two sets (e.g., steps) of conductive materials 103 and insulative materials 105 are shown for clarity.

As depicted, the conductive structure 100 may include multiple stair step or tiered structures (e.g., two or more stair step structures 106, 108, 110 positioned on one side of the semiconductor device 102) where at least two proximate (e.g., laterally adjacent) stair step structures (e.g., stair step structures 106, 108) are separated by a landing 112 (e.g., landing 112 that is substantially planar or otherwise lacks a stepped configuration). Stated another way, each pair of stair step structures may be separated by a landing 112. For example, stair step structures 106, 108, 110 may each be separated from the other stair step structure 106, 108, 110 (e.g., each adjacent stair step structure 106, 108, 110) by a landing 112. One or more of the stair step structures 106, 108, 110 may include an opposing stair step structure 107, 109, 111. In some embodiments, the stair step structures 107, 109, 111 may be a byproduct of formation of the main stair step structures 106, 108, 110 and may not include any electrical connections (e.g., may comprise dummy stair step structures that are not actively utilized in the conductive structure 100 as compared to the active stair step structures 106, 108, 110). Each set of stair step structures (e.g., 106, 107) may define a stadium (e.g., a recessed portion) of the conductive structure 100 while the landings 112 define a crest of the conductive structure 100.

In some embodiments, the conductive structure 100 may include multiple stair step or tiered structures may be similar to those described in, for example, in U.S. patent application Ser. No. 15/053,291, to Yip, filed Feb. 25, 2016, now U.S. Pat. No. 9,589,978, issued Mar. 7, 2017, for MEMORY DEVICES WITH STAIRS IN A STAIRCASE COUPLED TO TIERS OF MEMORY CELLS AND TO PASS TRANSISTORS DIRECTLY UNDER THE STAIRCASE, the disclosure of which is hereby incorporated herein in its entirety by this reference.

In some embodiments, the conductive materials 103 of the steps 114 may form a conductive plate (e.g., a word line plate) for supplying electrical signals to the semiconductor device 102 such as, for example, to a plurality of memory cells.

For clarity, reference is made in particular to stair step structure 108; however, it is understood that any of the other stair step structures may have the same configurations and elements. Steps 114 (e.g., steps 116, 118, 120, 122) of the stair step structure 108 may each include a contact portion 124 (e.g., a conductive landing pad positioned under a insulative material) to facilitate forming one or more connections (e.g., electrical connections) with each of the individual steps 114 as discussed in further detail below. In some embodiments, each step 114 may include a contact portion 124 that is offset (e.g., with respect to a longitudinal axis) from one or more adjacent steps 114. For example, step 118 includes a contact portion 124 (e.g., an exposed end portion of conductive material 103 of step 118) extending longitudinally beyond an adjacent step (e.g., step 116).

Referring still to FIG. 2, an opening such as, for example, one or more contact holes 126 (e.g., through array vias) may extend through conductive structure 100 at one or more of the landings 112. For example, landing 112 associated with the stair step structure 108 may include contact holes 126 extending from a distal side of the conductive structure 100 to the substrate 104 underlying the conductive structure 100. A conductive contact 128 may be disposed in each of the contact holes 126. The contacts 128 may extend through the stair step structure 108 and through the substrate 104 to another conductive element, such as one or more control units 130, which may be positioned under the conductive structure 100. In some embodiments, the contacts 128 may be formed from a conductive material such as, for example, a metal material (e.g., tungsten (W), nickel (Ni), tantalum nitride (TaN), Pt, tungsten nitride (WN), Au, titanium nitride (TiN), or titanium aluminum nitride (TiAlN)), polysilicon, or other conductive materials.

Each stair step structure (e.g., stair step structures 106, 108, 110) may be associated with one or more landings 112. For example, the stair step structures 106, 108, 110 may each be associated with one respective landing 112 adjacent the stair step structures 106, 108, 110 or adjacent an associated opposing stair step structures 107, 109, 111. In additional embodiments, the stair step structure 106, 108, 110 may be associated with two landings 112 positioned on opposing sides of the stair step structures 106, 108, 110 or associated opposing stair step structures 107, 109, 111.

The landing 112 provides conductive vias (e.g., contact holes 126 and contacts 128) substantially in line with the conductive structure 100 (e.g., within the boundary of, and not external to, the conductive structure 100). For example, such conductive vias (e.g., contact holes 126 and contacts 128) positioned within the boundaries of the conductive structure 100 and extending through the stack of material (e.g., alternating dielectric and conductive materials 103, 105) defining the stair step structures 106, 107, 108, 109, 110, 111 enable access lines 132 to be run through the conductive structure 100, without the need to route the access lines around lateral sides of the conductive structure 100 to access areas proximate the substrate 104.

It is noted that embodiments of the present disclosure are shown in the drawings as having contact holes 126 and contacts 128 positioned substantially in the same cross-sectional plane for convenience and clarity. It is contemplated that the contact holes and contacts may be formed in the same cross-sectional planes, differing cross-sectional planes, or combinations thereof.

In some embodiments, and as depicted in one instance in the landing 112 proximate stair step structure 106, the contact hole 126 may include an insulative liner 134 disposed between the contact 128 and the wall of contact hole 126 to insulate the contact 128 from at least a portion of the conductive structure 100 underlying the landing 112. For example, in instances where the landings 112 of the conductive structure 100 are similar to the sandwich-type structure of insulative and conductive material 103, 105 as the stair step structures 106, 108, 110, the insulative liner 134 may insulate the contact 128 from the conductive materials 103 of the steps 114. However, in additional embodiments, such a liner may not be necessary where the conductive structure 100 includes a replacement gate configuration (such as those discussed below), where portions of the conductive structure 100 underlying the landings are excluded (e.g., shielded or masked) from the replacement gate process and are comprised of (e.g., solely comprised of) dielectric materials.

Access lines 132, which may extend vertically and/or horizontally from the conductive material 103 of the steps 114, may electrically couple the conductive material 103 of the steps 114 to a control unit 130 (e.g., through contacts 128). The control unit or units 130 may include at least one of string driver circuitry, pass gates, circuitry for selecting gates, circuitry for selecting conductive lines (e.g., the access lines 132), circuitry for amplifying signals, and circuitry for sensing signals. For example, and as depicted, the one or more control units 130 may include transistors (e.g., so-called "pass gates") that are electrically coupled to access lines 132 for selecting a desired one of the conductive material 103 of the steps 114.

In a similar manner, each of the stair step structures 106, 108, 110 may include access lines 132 extending from respective steps 114 to an underlying conductive element, e.g., control units 130 through vias (e.g., contact holes 126 and contacts 128).

In some embodiments, one or more of the stair step structures (e.g., stair step structure 106) may comprise another select gate or gates (e.g., separate from the word line plate access lines 132, discussed above). For example, stair step structure 106 may be configured as a select gate drain (SGD) structure for communication with the semiconductor device 102 (e.g., to select certain arrays of memory cells) and may be coupled by select gates 136 to a SGD control unit 130 via contacts 128. As depicted, SGD stair step structure 106 may be separate from the other stair step structures 108, 110. However, in additional embodiments, the SGD stair step structure 106 may be formed as a portion of another stair step structure (e.g., a distal portion of another stair step structure relative to substrate 104, such as the two distalmost steps). For example, the SGD stair step structure 106 may comprise the distalmost steps 114 of stair step structure 108, where the remaining steps 114 act as landing pads for differing electrical connections (e.g., contact portions 124 for word line plates).

Figure 3:
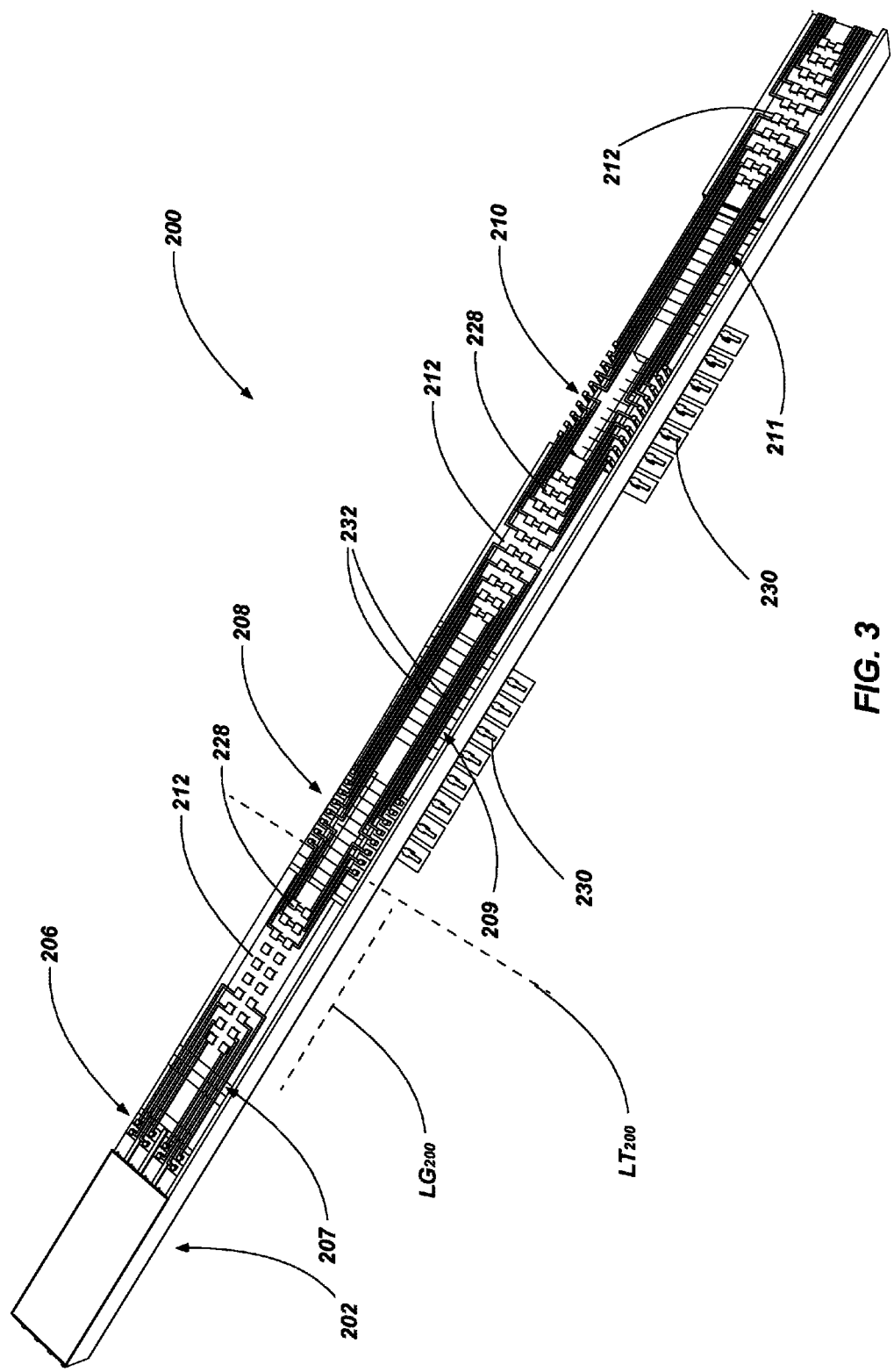
FIG. 3 is an isometric view of a portion of an electronic device including a conductive structure and a semiconductor device in accordance with an embodiment of the present disclosure.

FIG. 3 is an isometric view of a portion of an electronic device including a conductive structure 200 and a semiconductor device 202. The conductive structure 200 and/or semiconductor device 202 may be similar to and include one or more of the same features and functioning as conductive structure 100 and semiconductor device 102 discussed above with reference to FIGS. 1 and 2. As shown in FIG. 3, the conductive structure 200 may include multiple stair step or tiered structures (e.g., two or more stair step structures 206, 208, 210) where at least two proximate (e.g., adjacent) stair step structures (e.g., stair step structures 206, 208) are separated by a landing 212 (e.g., landing 212 that is substantially planar or otherwise lacks a stepped configuration). For example, stair step structures 206, 208, 210 may each be separated from the other stair step structures 206, 208, 210 (e.g., each adjacent stair step structure 206, 208, 210) by a landing 212. One or more of the stair step structures 206, 208, 210 may include an opposing stair step structure 207, 209, 211. In some embodiments, these stair step structures 207, 209, 211 may be a byproduct of formation of the main stair step structures 206, 208, 210 and may not include any electrical connections (e.g., may comprise dummy stair step structures that are not actively utilized in the conductive structure 200). Each set of stair step structures (e.g., 206, 207) may define a stadium (e.g., a recessed portion) of the conductive structure 200 while the landings 212 define a crest of the conductive structure 200.

As depicted in FIG. 3, the series of stair step structures 206, 207, 208, 209, 210, 211 and landings 212 may continue, for example, until the requisite number of stairs utilized to control the corresponding semiconductor device 202 is reached. In some embodiments, the end of the conductive structure 200 opposing the semiconductor device 202 may comprise an insulative material in order to isolate the conductive portions of the conductive structure 200 (e.g., conductive portions of the word line plates) at that end. Such an insulative material may be disposed in a slot extending along a lateral length or lateral axis $LT_{200}$ of the conductive structure 200 (e.g., a slot defined through a replacement gate (RG) process, as discussed below).

Access lines 232 may be coupled to conductive portions 218 of stairs in each of the stair step structures 206, 208, 210. The access lines 232 may extend along the elongated conductive structure 200 to contacts 228 in the one or more of the landings 212. The contacts 228 may extend through the stair step structure 208 to another conductive element, such as one or more control units 230, which may be positioned under the conductive structure 200.

Figure 4:
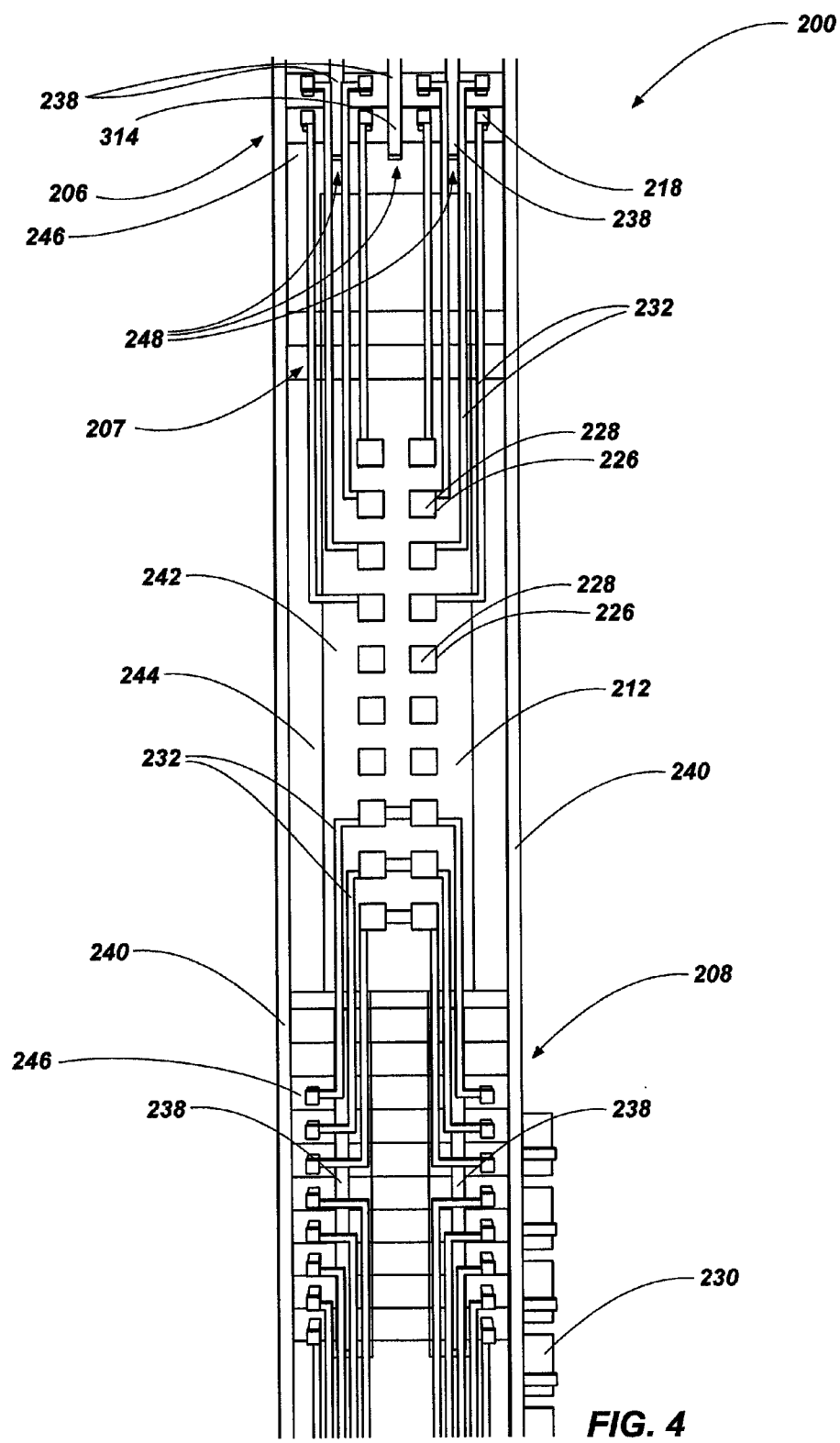
FIG. 4 is a top view of a portion of the conductive structure of the electronic device of FIG. 3.

FIG. 4 is a top view of a portion of the conductive structure 200 of the electronic device of FIG. 3. Referring to FIGS. 3 and 4, the conductive structure 200 may include stack slotting extending along the conductive structure 200 (e.g., along a portion or a majority of the longitudinal length or longitudinal axis $LG_{200}$ of the conductive structure 200). For example, the stack slotting may include inner stack slot elements 238 positioned within the lateral extent of the conductive structure 200 and outer stack slot elements 240 positioned proximate (e.g., at) opposing outer lateral extents of the conductive structure 200. As depicted, the outer stack slot elements 240 may define the outermost lateral extent or boundary of the conductive structure 200 on each lateral side of the conductive structure 200.

As discussed below in greater detail, the stack slot elements 238, 240 may include both conductive and insulative materials that are at least partially deposited in a trench or slot (e.g., through a replacement gate (RG) process) and act to form the conductive portions of the steps of the stair step structures 206, 208, 210. As mentioned above, in some embodiments, stack slot elements may also be disposed at a longitudinal end of the conductive structure 200 opposing the semiconductor device 202 to isolate the longitudinal end of the conductive structure 200 (e.g., the longitudinal ends of the plates) from any adjacent devices and/or conductive materials.

As further depicted, at least a portion of the stack slot elements (e.g., inner stack slot elements 238) may be discontinuous. For example, inner stack slot elements 238 may extend only along a portion of the conductive structure 200 in regions along the steps of the active stair step structures 206, 208, 210. In such an embodiment, the landings 212 or portions of the conductive structure surrounding the contacts 228 may lack the inner stack slot elements 238. For example, the landings 212 or portions of the conductive structure 200 surrounding the contacts 228 may include only the outer stack slot elements 240 and lack the inner stack slot elements 238.

As also depicted, another portion of the stack slot elements (e.g., outer stack slot elements 240) may be substantially continuous along the conductive structure 200. For example, outer stack slot elements 240 may extend along at least a majority (e.g., an entirety) of the conductive structure 200 (e.g., and the semiconductor device 202) to define an outermost extent or boundary of one or more sides of the conductive structure 200.

In some embodiments, the inner stack slot elements 238 may act to define sub-blocks (e.g., sub-steps, sub-tiers, sub-plates) of the stair step structures 206, 208, 210.

In some embodiments, the stack slot elements 238, 240 may at least partially comprise a dielectric or insulative material formed through a replacement gate (RG) process and may define insulative sides of the conductive structure 200.

FIGS. 5 through 9 are simplified cross-sectional side views of a portion of a workpiece such as a precursor structure under fabrication and illustrate an embodiment of a method of the present disclosure that may be used to form a portion of the conductive structure 200. In particular, FIGS. 5 through 9 illustrate a simplified or idealized example of a replacement gate (RG) process through which the stack slot elements 238, 240 may be formed in the conductive structure 200.

In each of the embodiments discussed below, the materials forming the conductive structures may be formed by, for example, growing, diffusing, depositing, or otherwise providing thereon. The various materials may be formed using, for example, deposition techniques (e.g., chemical vapor deposition (CVD), physical vapor deposition (PVD), atomic layer deposition (ALD), sputtering, thermal evaporation, or plating), oxidation processes (e.g., thermal oxidation, ISSG oxidation), and patterning techniques (e.g., masking and etching) known in the art of integrated circuit fabrication. The insulative materials may be formed by chemical vapor deposition, by decomposing tetraethyl orthosilicate (TEOS), or by any other process known in the art of integrated circuit fabrication.

Additionally, the materials or portions thereof may be removed using, for example, an abrasion or polishing process (e.g., a chemical-mechanical planarization (CMP) process, a chemical polishing process, a mechanical planarization process), an etching process, a lift-off process, or a combination thereof. Etching processes may include, for example, wet or dry etching such as removing portions of a material using a mask and an anisotropic etching process (e.g., a reactive ion etching process, such as using a plasma) or removing portions of a material using a mask and an isotropic process (e.g., a chemical etching process). It is noted that the particular composition of the gases used to generate the reactive ions, the particular composition of the chemical etchant, and the operating parameters of the etching process may be selected based on the composition of the mask, the material to be etched, and the surrounding materials.

Figure 5:
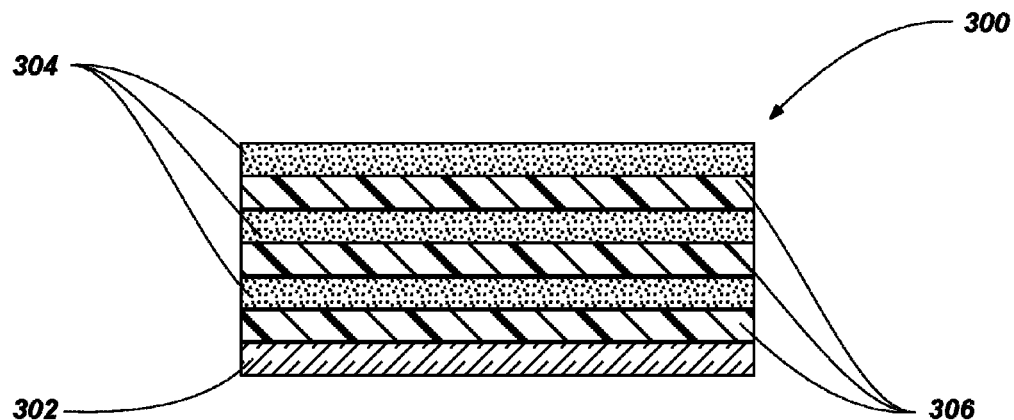
FIGS. 5 through 9 are simplified cross-sectional side views of a portion of a workpiece and illustrate an embodiment of a method of the present disclosure that may be used to form a portion of a conductive structure like that shown in FIGS. 1 through 4.

As shown in FIG. 5, a stack of material 300 (e.g., utilized to ultimately define a tiered or stepped structure) is provided on a substrate 302. The stack of materials 300 may include alternating materials (e.g., alternating insulative, which may be characterized as dielectric, materials). For example, the stack of materials 300 may include insulative materials 304 (e.g., an oxide) interleaved with sacrificial materials 306 that comprise a material different from the insulative materials 304 (e.g., a nitride). It is noted that the below described acts, may be performed before, after, or concurrently with the forming of the stair step structure.

Figure 6:
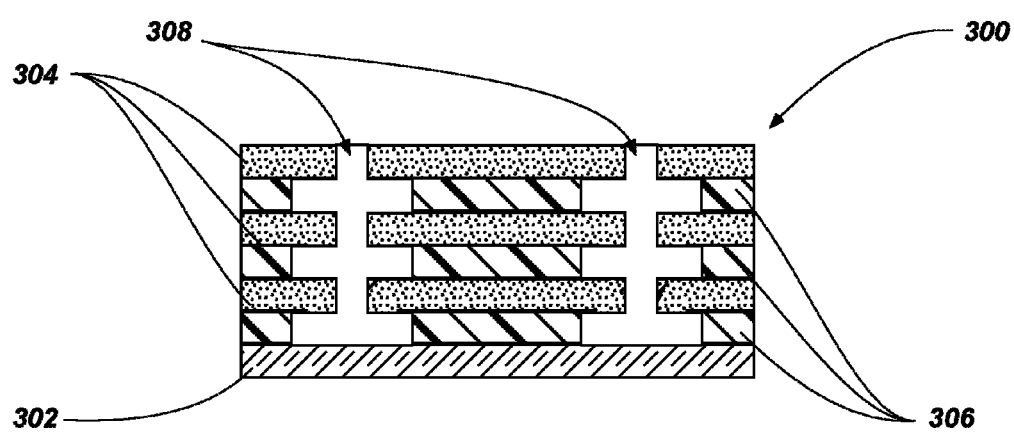

As shown in FIG. 6, one or more slots 308 may be formed through the stack of materials 300 extending to the substrate 302 (e.g., through an isotropic etch, through an anisotropic etch followed by an isotropic etch, etc.). The slots 308 may be formed with an isotropic etchant that is selective to the material (e.g., nitride) of the sacrificial materials 306 to provide lateral openings extending from the slot 308 into the sacrificial materials 306.

Figure 7:
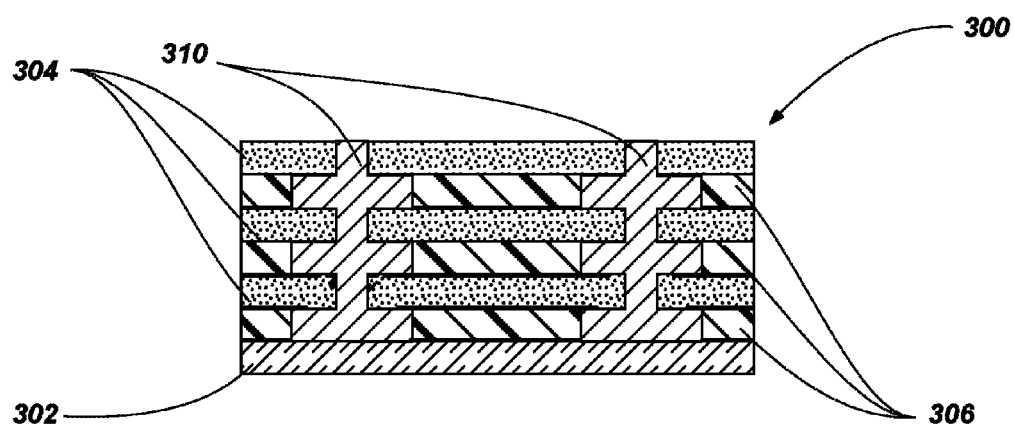

As shown in FIG. 7, a conductive material 310 (e.g., a metal, such as tungsten) is deposited in the slots 308 where the sacrificial materials 306 have been removed.

Figure 8:
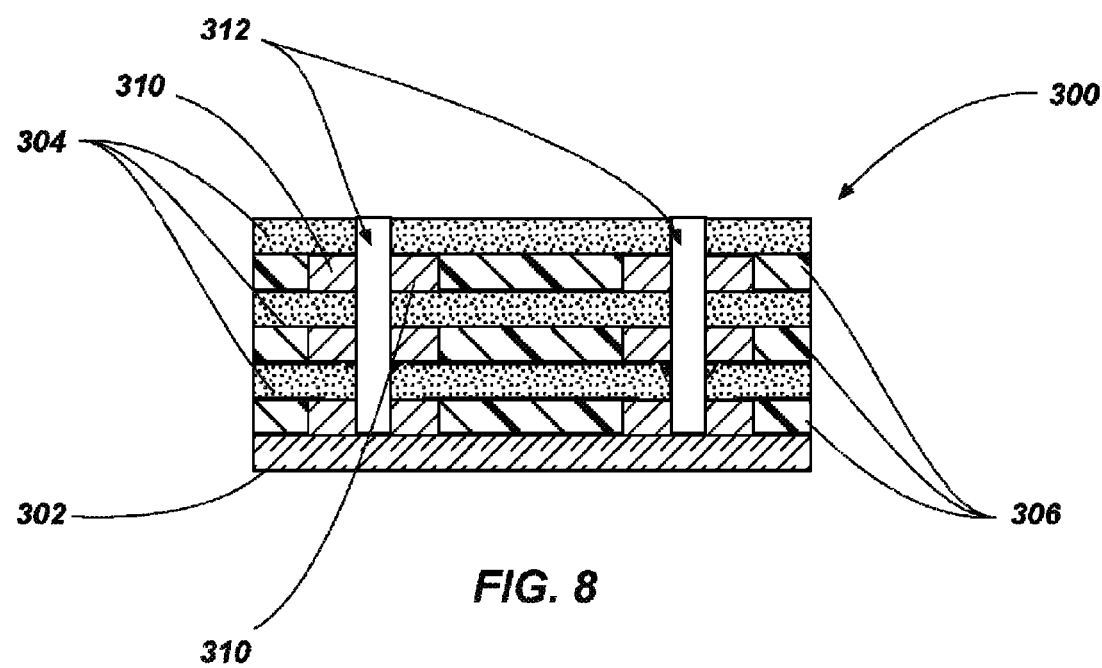

As shown in FIG. 8, at least a portion of the conductive material 310 in the slots 308 is removed to form slots 312. For example, conductive material 310 in the slots 308 may be removed by an anisotropic etch to form slots 312. Such removal of a portion of the conductive material 310 may act to separate the conductive material 310 of one step (e.g., level) of the stack of material 300 from the conductive material 310 adjacent steps (e.g., to reduce the probability of shorting between conductive portions of each step of the stack of material 300, e.g., forming word line plates). Stated in another way, the conductive material 310 of each step the stack of material 300 is removed such that the remaining material will be conductive material 310 separated by the insulative materials 304 (i.e., conductive material will not extend between steps the stack of material 300).

Figure 9:
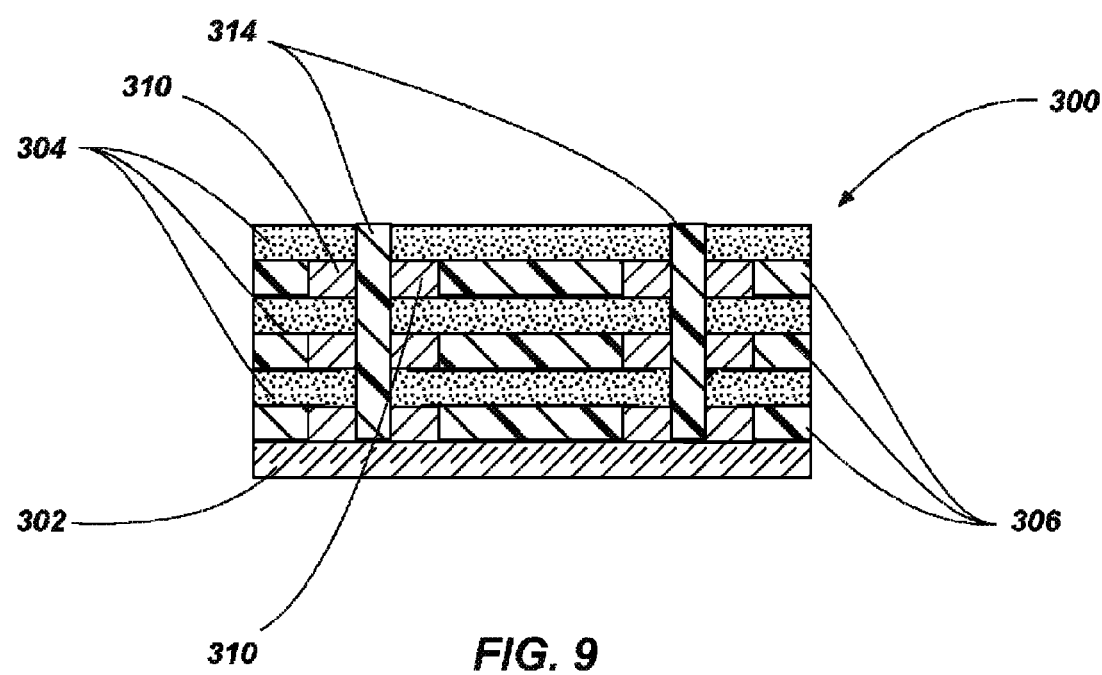

As shown in FIG. 9, another insulative material 314 is deposited in the slots 312. In this manner, stack slot elements (e.g., stack slot elements 238, 240 as discussed in relation to FIG. 4) may be formed with the conductive materials 310 and the insulative materials 314. The conductive material 310 in the steps of the sacrificial material 306 of the stack of material 300 may now at least partially define a contact portion (e.g., contact portion 124 as described with reference to FIG. 2) of a stair case structure that may be coupled to the access lines 132, 232 (FIGS. 2 through 4).

Referring back to FIGS. 3 and 4, in embodiments where conductive portions of the stair step structures 206, 208, 210 are formed using a replacement gate process (e.g., such as that described above), the lack of the inner stack slot elements 238 proximate the landings 212 and/or the portions of the conductive structure 200 surrounding the contacts 228 may enable formation of contact holes 226 that are provided for the respective contacts 228 to be formed directly through the conductive structure 100 without the need to otherwise insulate the contact holes 226. For example, landing region 242 surrounding the contacts 228 may lack any conductive materials in a direction extending from the proximal portion of the conductive structure 200 to the distal portion of the conductive structure 200 (e.g., along an axis extending between the landing region 242 and an underlying substrate (e.g., substrate 104 (FIG. 2)). That is, as described above with reference to FIGS. 5 through 9, conductive materials 310 are only introduced in the stack of materials 300 where the stack slot elements 238, 240 (e.g., the conductive materials 310 and the insulative materials 314) are formed. Thus, the landing region 242 lacking stack slot elements 238, 240 comprising only insulative materials enables the vias (e.g., contact holes 226 and associated contacts 228) to extend directly through such insulative materials. In contrast, another outer region 244 of the landings 212 may include conductive materials 310 in a direction extending from the proximal portion to the distal portion of the conductive structure 200 as these regions 244 are proximate the outer stack slot element 240. These outer regions 244 of the landings 212 may ensure that steps of the stair step structures 206, 208, 210 remain in electrical communication with the semiconductor device 202.

In some embodiments, formation of the stack slot elements 238, 240 (e.g., inner stack slot elements 238) will act to keep the segmented sub-blocks of the stair step structures 206, 208, 210 at least partially in electrical communication. For example, a plate 246 defining the bottommost (e.g., proximal) step (e.g., word line plate) of one of the stair step structures (e.g., stair step structure 206) may continue along a length of the conductive structure 200 (e.g., in a longitudinal direction away from the semiconductor device 202) to one or more other stair step structures (e.g., stair step structure 208). For example, plate 246 extends from stair step structure 206 to stair step structure 208 to also define the uppermost connected step (e.g., a step connected to an access line 232) of the stair step structure 208. In order electrically connect the sub-blocks of the plate 246 that are divided in the replacement gate (RG) process at the stair step structure 206, plate 246 may be shorted (e.g., at one or more short regions 248) around one or more ends of the inner stack slot elements 238 proximate stair step structure 206 (e.g., between the conductive stair step structure 206 and the insulative landing region 242).

In particular, during formation of the inner stack slot elements 238 (e.g., through the process discussed above in relation to FIGS. 5 through 9), the conductive material 310 (e.g., tungsten) may partially bleed into the sacrificial material 306. In such a configuration, even after insulative material 314 is disposed in the slot 312 formed in the conductive material 310, the conductive material 310 may extend around an end of the insulative material 314, creating the short regions 248 (e.g., an electrical connection or short) between sub-blocks of the conductive material of plate 246 at the ends of the inner stack slot elements 238. Although this shorting has been discussed in particularity to stair step structure 206, any of the stair step structures may include such a feature.

Figure 10:
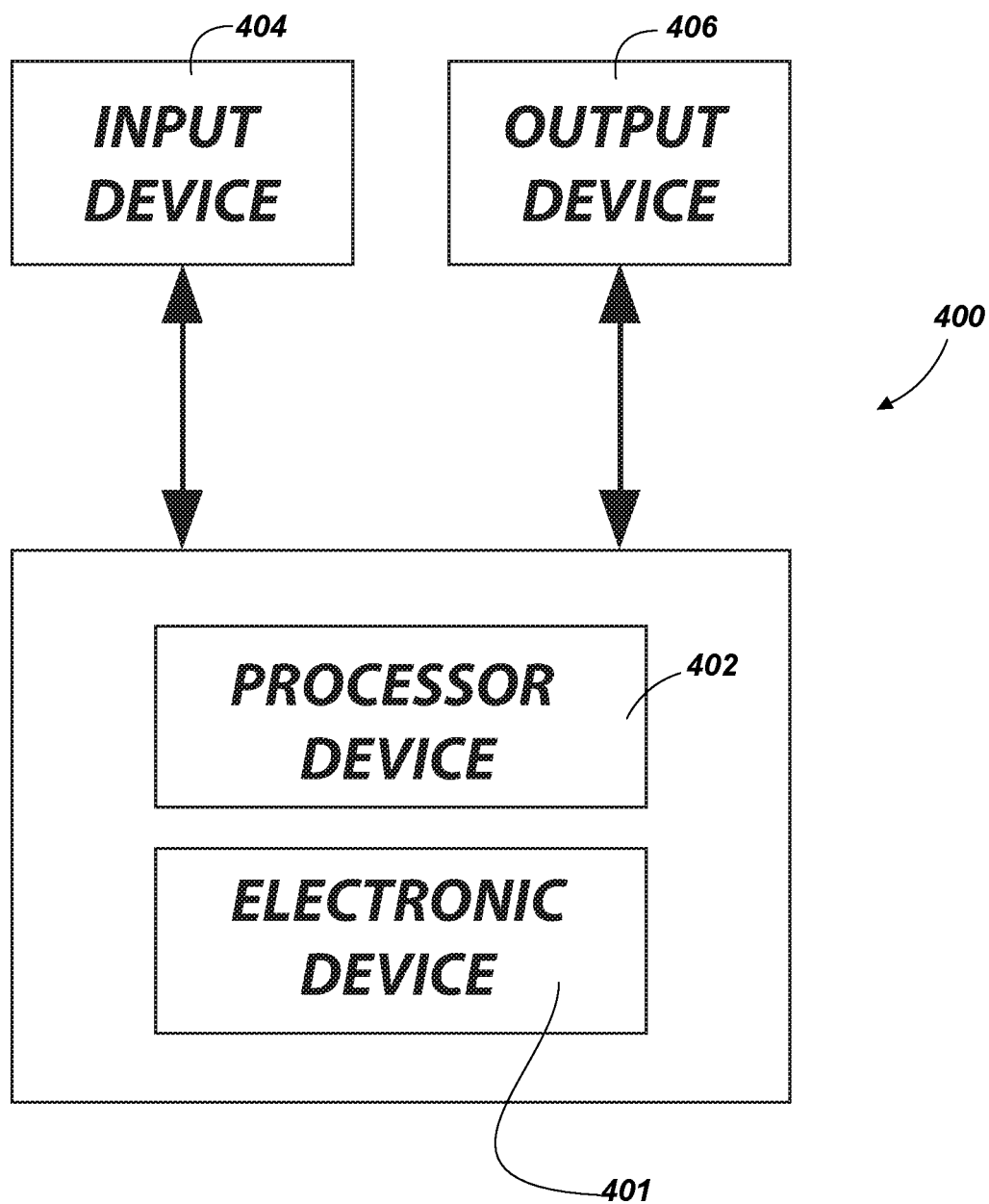
FIG. 10 is a schematic block diagram illustrating one embodiment of an electronic system that includes an electronic device (e.g., a memory device) like the electronic devices shown in FIGS. 1 through 4.

Electronic device (e.g., memory devices) like that shown in FIGS. 1 through 4 may be used in embodiments of electronic systems of the present disclosure. For example, FIG. 10 is a block diagram of an illustrative electronic system 400 according to the present disclosure. The electronic system 400 may comprise, for example, a computer or computer hardware component, a server or other networking hardware component, a cellular telephone, a digital camera, a personal digital assistant (PDA), portable media (e.g., music) player, etc. The electronic system 400 includes at least one electronic device 401, such as one of the embodiments of the electronic devices (e.g., conductive structures 100, 200 and semiconductor devices 102, 202) shown and described above with reference to FIGS. 1 through 4. The electronic system 400 further may include at least one electronic signal processor device 402 (often referred to as a "microprocessor"). The electronic system 400 may, optionally, further include one or more input devices 404 for inputting information into the electronic system 400 by a user, such as, for example, a mouse or other pointing device, a keyboard, a touchpad, a button, or a control panel. The electronic system 400 may further include one or more output devices 406 for outputting information (e.g., visual or audio output) to a user such as, for example, a monitor, display, printer, speaker, etc. The one or more input devices 404 and output devices 406 may communicate electrically with at least one of the electronic device 401 and the electronic signal processor device 402.

Embodiments of the present disclosure may be particularly useful in forming conductive structures (e.g., an elongated stair step structure having multiple stair step regions) that enable communication with one or more semiconductor devices (e.g., a CMOS device such a word line driver, memory cells, etc.) utilizing contacts (e.g., through array vias (TAVs) positioned in landings between the stair step regions) that enable direct communication with underneath circuitry by interrupting the metallization inside the stair step structure without area penalty and/or need of special self-insulating contact processes. Such configurations may enable a relatively more direct route of connection through the conductive structure as compared to conventional conductive structures in which contacts extend external to the stair step conductive structure in configurations that extend up from and over the sides of the stair step conductive structure. Moreover, such a configuration with contacts extending through the conductive structure may reduce the need for forming tight pitch wiring above the stair step conductive structure by enabling a relatively simplified and shortened route of connection to conductive elements positioned beneath the conductive structure. Further, in embodiments where a replacement gate (RG) process in implemented, the vias may be formed directly through insulative or dielectric materials, thereby, eliminating the need for extra processing steps to insulate the vias from surrounding conductive materials. Further still, the discontinuous stack slotting provided by the replacement gate process disclosed herein enables electrical connections to be formed between sub-blocks of the step of the stair case structure without the need for additional conductive steps to connect the sub-blocks. The discontinuous stack slotting may further provide dielectric areas for the TAVs to extend through that have not been altered in the replacement gate process (e.g., which process generally requires removal and redepositing of the dielectric materials). Such dielectric areas for the TAVs that are not altered in the replacement gate process may be less susceptible to problems introduced by inhomogeneous and/or defective filling that may occur during redepositing of the dielectric materials. Further still, the elongated staircase structure provides intermittent landing areas between the staircases that may be utilized to efficiently route access lines from relatively smaller groups of tiered word line plates through the staircase structure without having to increase the pitch of the staircase in order to accommodate external access lines extending around the staircase structure. Finally, the elongated staircase structure, which includes staircases extending along only one axis (e.g., staircases stepped only along the longitudinal axis), may be relatively less complex to fabricate (e.g., may include larger tolerances for variations in material etching) while still providing adequate landing areas on each step, as compared to conventional staircase structures that include longitudinally adjacent tiers of laterally extending steps (i.e., staircases that are stepped along both the longitudinal and lateral axes).

Accordingly, a conductive structure includes stair step structures positioned along a length of the conductive structure, each stair step structure comprising at least two conductive steps. Each conductive step of the at least two conductive steps is at least partially separated from an adjacent conductive step of the at least two conductive steps by insulative material. The conductive structure further includes at least one landing comprising at least one via extending through the conductive structure. The at least one landing is positioned between a first stair step structure of the stair step structures and a second stair step structure of the stair step structures positioned adjacent to the first stair step structure.

Further, a device may include memory cells and a conductive structure positioned adjacent to the memory cells. The conductive structure further includes at least one control device for selecting portions of the memory cells and at least one landing comprising vias extending through the at least one landing to the at least one control device. The at least one landing is positioned between a first stair step structure of the stair step structures and a second stair step structure of the stair step structures.

Further still, a system may include at least one electronic signal processor, a semiconductor device configured to communicate electrically with the at least one electronic signal processor, and a conductive structure. The conductive structure includes stair step structures positioned along a length of the conductive structure wherein each stair step structure is in electrical communication with the semiconductor device. The conductive structure further includes at least one landing positioned between a first stair step structure of the stair step structures and a second stair step structure of the stair step structures. The at least one landing includes alternating first materials and second materials where the first materials and the second materials comprise an insulative material and vias extending through the alternating first materials and second materials.

Further still a method of forming a conductive structure may include forming openings through a stack of material at a landing of the conductive structure defined between two stair step structures where the two stair step structures are positioned on one side of and in electrical communication with a semiconductor device, forming contacts in the openings in the stack, and electrically coupling a conductive portion of at least one step of the stair step structure with at least one contact of the contacts.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, combinations, equivalents, and alternatives falling within the scope of the present disclosure as defined by the following appended claims and their legal equivalents.

What is claimed is:

1. A conductive structure, comprising:
    stair step structures positioned along a length of the conductive structure, each stair step structure comprising at least two conductive steps, each conductive step of the at least two conductive steps being at least partially separated from an adjacent conductive step of the at least two conductive steps by insulative material;
    at least one landing comprising at least one via extending through the conductive structure underlying and defining the at least one landing, the at least one landing positioned between a first stair step structure of the stair step structures and a second stair step structure of the stair step structures positioned adjacent to the first stair step structure; and
    access lines, each access line in communication with a conductive portion of one conductive step of the at least two conductive steps of the stair step structures and extending from the one conductive step to, and being in communication with, the at least one via extending through the conductive structure underlying and defining the at least one landing.

2. The conductive structure of claim 1, wherein the at least one via comprises a plurality of vias, and wherein each access line extends from a conductive portion of one conductive step of at least two conductive steps of the stair step structures to one via of the plurality of vias.

3. The conductive structure of claim 1, further comprising at least one pair of additional stair step structures and at least one additional landing, each additional stair step structure of the at least one pair of additional stair step structures opposing another stair step structure of the at least one pair with the at least one additional landing therebetween.

4. The conductive structure of claim 1, wherein at least one of the stair step structures lacks access lines connected to conductive steps of the at least one stair step structure.

5. The conductive structure of claim 1, wherein the at least one landing comprises a plurality of landings, each landing of the plurality of landings being positioned between a pair of the stair step structures.

6. The conductive structure of claim 1, wherein the at least one landing is defined by a stack of alternating first material and second material, wherein the first material and the second material each comprise an insulative material.

7. The conductive structure of claim 1, wherein the at least one landing is defined by a stack of alternating first material and second material, wherein the first material comprises a conductive material and the second material comprises an insulative material.

8. The conductive structure of claim 7, further comprising an insulative liner at least partially surrounding the at least one via and insulating the at least one via from the conductive material of the at least one landing.

9. The conductive structure of claim 1, wherein the at least one via is operably coupled to at least one control unit underlying the stair step structures and the at least one landing.

10. The conductive structure of claim 1, wherein at least some of the stair step structures each comprise a word line plate structure.

11. The conductive structure of claim 1, wherein one stair step structure of the stair step structures comprises a drain select gate (SGD) structure.

12. The conductive structure of claim 1, further comprising stack slot elements extending along a length of the conductive structure.

13. The conductive structure of claim 12, wherein the stack slot elements comprise:
    outer stack slot elements extending continuously along a majority of the length of the conductive structure; and
    inner stack slot elements extending discontinuously along the length of the conductive structure.

14. The conductive structure of claim 13, wherein the inner stack slot elements are positioned proximate the stair step structures.

15. The conductive structure of claim 14, wherein the at least one landing lacks the inner stack slot elements.

16. The conductive structure of claim 13, wherein the stack slot elements comprise an insulative material positioned over a conductive material deposited in a replacement gate process.

17. A method of forming the conductive structure of claim 1, the method comprising:
forming openings through a stack of material at the at least one landing of the conductive structure defined between two of the stair step structures, the two stair step structures being positioned on one side of and in electrical communication with a semiconductor device;
forming contacts in the openings in the stack of the material; and
electrically coupling a conductive portion of at least one step of the stair step structure with at least one contact of the contacts.

18. The method of claim 17, further comprising forming the stack of material with alternating insulative and conductive materials.

19. The method of claim 18, further comprising forming a liner in each opening of the openings to surround a contact therein.

20. The method of claim 17, further comprising forming the stack of material with alternating insulative materials comprising a first insulative material and a second sacrificial insulative material.

21. The method of claim 20, further comprising:
forming an opening through the stack of material;
removing a portion of the second sacrificial insulative material adjacent the opening in a volume of the second sacrificial material underlying the first insulative material; and
depositing a conductive material in the opening and in the volume from which the portion of the second sacrificial material is removed to form the conductive portion of at least one step of the stair step structure.

22. The method of claim 21, further comprising:
removing a portion of the conductive material within the opening; and
depositing another insulative material within the opening.

23. The method of claim 22, further comprising forming an electrical connection between the conductive portion of at least one step of the stair step structure and another, adjacent conductive portion of the at least one step around the another insulative material.

24. The method of claim 17, further comprising performing a replacement gate process on at least one stair step structure of the stair step structures while masking the landing of the conductive structure.

25. A conductive structure, comprising:
tiered structures positioned along a length of the conductive structure, each tiered structure comprising at least two tiers having a conductive portion, each conductive portion of the at least two tiers being at least partially separated from an adjacent conductive portion of the at least two tiers by insulative material; and
a landing comprising vias extending through the conductive structure at the landing, the landing and the vias positioned between a first tiered structure of the tiered structures and a second tiered structure of the tiered structures positioned adjacent to the first tiered structure.

26. The conductive structure of claim 25, further comprising access lines coupling conductive portions of the at least two tiers of the tiered structures to a respective via of the vias.

27. The conductive structure of claim 25, further comprising stack slot elements extending along the length of the conductive structure, wherein at least one stack slot element of the stack slot elements extends discontinuously along the length of the conductive structure.

28. The conductive structure of claim 27, wherein the at least one discontinuous stack slot element at least partially physically and electrically separates at least one tier of the tiered structure of the tiered structures into a first sub-tier portion and a second sub-tier portion.

29. The conductive structure of claim 28, wherein a short in the at least one tier defined along an end of the at least one discontinuous stack slot element electrically connects the first sub-tier portion and the second sub-tier portion.

30. The conductive structure of claim 27, wherein the at least one discontinuous stack slot element is positioned laterally within one tiered structure of the tiered structures separated from lateral sides of the conductive structure.

31. The conductive structure of claim 30, wherein at least another stack slot element of the stack slot elements extends continuously along the length of the conductive structure, wherein the at least one continuous stack slot element defines at least a portion of a lateral side of the conductive structure.

32. A device, comprising:
an array of memory cells; and
a conductive structure positioned adjacent to the array of memory cells, the conductive structure comprising:
stair step structures positioned along a length of the conductive structure, each stair step structure being in electrical communication with memory cells of the array;
at least one control device for selecting memory cells of the array;
at least one landing positioned between a first stair step structure of the stair step structures and a second stair step structure of the stair step structures;
vias extending through the at least one landing to the at least one control device; and
access lines coupled between conductive portions of the stair step structures and extending to the at least one landing, each access line of the access lines being coupled to a first end of a respective via of the vias, wherein a second end of each of the vias is electrically coupled to the at least one control device.

33. The device of claim 32, wherein the stair step structures comprise word line plates.

34. The device of claim 32, wherein each word line plate of the word line plates comprises a contact portion laterally offset from a contact portion of an adjacent word line plate of the word line plates, and wherein each access line of the access lines is in communication with a respective one of the word line plates and couples the respective one of the word line plates to a respective via of the vias.

35. A system, comprising:
at least one electronic signal processor;
a semiconductor device configured to communicate electrically with the at least one electronic signal processor; and
a conductive structure comprising:
stair step structures positioned along a length of the conductive structure, each stair step structure being in electrical communication with the semiconductor device;

at least one landing positioned between a first stair step structure of the stair step structures and a second stair step structure of the stair step structures, the at least one landing comprising:
alternating first materials and second materials, wherein the first materials and the second materials comprise an insulative material; and
vias extending through the first materials and the second materials.

36. The system of claim 35, further comprising at least one stack slot element laterally spaced from an outer lateral boundary of the conductive structure, the at least one stack slot element extending only along the length of the conductive structure proximate the stair step structures.

37. The system of claim 36, wherein the stack slot elements comprise an insulative material and a conductive material, the conductive material defining a conductive portion of one step of the stair step structures.

38. system of claim 37, further comprising access lines, each access line coupling the conductive portion of the one step of the stair step structures to a respective via of the vias.

* * * * *

UNITED STATES PATENT AND TRADEMARK OFFICE
CERTIFICATE OF CORRECTION

PATENT NO. : 9,941,209 B2  
APPLICATION NO. : 15/068329  
DATED : April 10, 2018  
INVENTOR(S) : Paolo Tessariol, Graham R. Wolstenholme and Aaron Yip It is certified that error appears in the above-identified patent and that said Letters Patent is hereby corrected as shown below:

In the Claims

Claim 28, Column 16, Line 9, change "at least one tier of the" to --at least one--

Signed and Sealed this  
Twenty-second Day of May, 2018

Andrei Iancu  
*Director of the United States Patent and Trademark Office*